United States Patent
Cambou

(10) Patent No.: US 9,948,873 B2
(45) Date of Patent: Apr. 17, 2018

(54) COMPACT HUMAN PRESENCE DETECTOR

(71) Applicant: IRLYNX, Montbonnot-Saint-Martin (FR)

(72) Inventor: Pierre Cambou, Grenoble (FR)

(*) Notice: Subject to any disclaimer, the term of this patent is extended or adjusted under 35 U.S.C. 154(b) by 335 days.

(21) Appl. No.: 14/889,649

(22) PCT Filed: May 5, 2014

(86) PCT No.: PCT/EP2014/059108
§ 371 (c)(1),
(2) Date: Nov. 6, 2015

(87) PCT Pub. No.: WO2014/180783
PCT Pub. Date: Nov. 13, 2014

(65) Prior Publication Data
US 2016/0073042 A1   Mar. 10, 2016

(30) Foreign Application Priority Data
May 6, 2013  (FR) ...................... 13 54137

(51) Int. Cl.
| | |
|---|---|
| *H04N 5/33* | (2006.01) |
| *H04N 5/374* | (2011.01) |
| *G08B 13/191* | (2006.01) |
| *G08B 13/193* | (2006.01) |
| *G08B 29/18* | (2006.01) |
| *H01L 37/02* | (2006.01) |
| *G01J 5/08* | (2006.01) |
| *G01J 5/34* | (2006.01) |
| *G01J 5/00* | (2006.01) |
| *G02B 3/08* | (2006.01) |

(52) U.S. Cl.
CPC .............. *H04N 5/33* (2013.01); *G01J 5/0025* (2013.01); *G01J 5/0806* (2013.01);
(Continued)

(58) Field of Classification Search
CPC ......... G01J 2005/0077; G01J 2005/345; G01J 5/0025; G01J 5/0806; G01J 5/0846;
(Continued)

(56) References Cited

U.S. PATENT DOCUMENTS 5,541,414 A    7/1996  Hori
5,808,350 A    9/1998  Jack et al.
(Continued)

FOREIGN PATENT DOCUMENTS

EP    0 633 554 A1    1/1995
FR    2 925 765 A1    6/2009

OTHER PUBLICATIONS

Aug. 8, 2014 International Search Report issued in International Patent Application No. PCT/EP2014/059108.

*Primary Examiner* — Anner N Holder
(74) *Attorney, Agent, or Firm* — Oliff PLC

(57) ABSTRACT

A multimodal and highly compact human presence detector that includes, on a same silicon chip made using CMOS technology, a first array of pixels, made sensitive to far-infrared radiation by depositing a pyroelectric layer, converting the received far-infrared radiation into electrical charges, juxtaposed with at least one second array of pixels sensitive to visible light, converting the received visible light into electrical charges, and a circuit for reading the charges generated in each of the arrays by the visible light or the far-infrared radiation, the detector further including, on top of the silicon chip, an optical element for focusing the far-infrared radiation on the first array, and an optical element for focusing the visible light on the second array.

9 Claims, 3 Drawing Sheets

(52) U.S. Cl.
CPC ............... *G01J 5/0846* (2013.01); *G01J 5/34* (2013.01); *G02B 3/08* (2013.01); *G08B 13/191* (2013.01); *G08B 13/193* (2013.01); *G08B 29/183* (2013.01); *H01L 37/02* (2013.01); *H01L 37/025* (2013.01); *H04N 5/374* (2013.01); *G01J 2005/0077* (2013.01); *G01J 2005/345* (2013.01)

(58) Field of Classification Search
CPC ........... G01J 5/34; G02B 3/08; G08B 13/191; G08B 13/193; G08B 29/183; H01L 37/02; H01L 37/025; H04N 5/33; H04N 5/374
See application file for complete search history.

(56) References Cited

U.S. PATENT DOCUMENTS

| | | | | |
|---|---|---|---|---|
| 6,137,407 | A * | 10/2000 | Akagawa | G08B 13/19 340/541 |
| 7,381,953 | B1 * | 6/2008 | Kaufman | H01L 25/167 250/332 |
| 9,534,958 | B1 * | 1/2017 | Lhamon | G01J 5/0025 |
| 2010/0296703 | A1 * | 11/2010 | Marti | G06K 9/00697 382/103 |
| 2010/0323458 | A1 | 12/2010 | Fritsch et al. | |
| 2012/0268646 | A1 | 10/2012 | Luo | |

\* cited by examiner

COMPACT HUMAN PRESENCE DETECTOR

The invention relates to the detection of human presence in a given environment.

There are many situations in which it is necessary to detect the presence of a person, usually for safety reasons, but sometimes for other reasons. For example, it is sought to detect malicious intrusions in premises or a protected area, or to ensure that nobody is present in a dangerous area before executing a maneuver, e.g. in the path of a sliding elevator door or garage overhead door, behind a reversing vehicle or in front of an advancing vehicle, etc. But applications unrelated with safety can also be considered, such as counting people present in an area or the flow of people on a trajectory, and all sorts of other applications in the field of human-machine interaction, where it is desirable to detect the presence of persons in the vicinity of a machine.

Various more or less sophisticated systems exist to perform such detections: simple laser-diode illuminated photocell detectors for sliding or overhead doors, these cells providing only very limited information, i.e. all or nothing. There are also digital cameras, thermal infrared cameras, lidars (laser sensors providing three-dimensional measures), radars, or even a combination of several of these devices to enhance the ability to detect, identify, or count people. The existing systems are expensive.

It has been proposed in patent publication U.S. 2012/0268646 to use a matrix of pixels sensitive to visible light in which some pixels are covered with an infrared detector and a light emitting diode that converts the received infrared energy to visible light detectable by the underlying pixel. It has also been proposed in U.S. Pat. No. 5,808,350 to cover each pixel sensitive to visible light with a bolometer. The pixels described in these documents require sophisticated manufacturing technologies because the elements that provide an infrared radiation detection signal are superimposed on the pixels that detect visible light.

The invention aims to provide a multimodal human presence detector that optimizes the cost of the detection by avoiding the use of too complex and too expensive systems and yet is capable of providing rich image information on people that may be present in the observation field.

According to the invention there is provided a human presence sensor including on a same silicon chip made in CMOS technology a first array of pixels, made sensitive to far infrared radiation by depositing a pyroelectric layer, converting the received far infrared radiation into electric charges, juxtaposed with at least one second array of pixels responsive to visible light, converting the received visible light into electric charges, and a circuit for reading the charges generated in each of the arrays by the visible light or far infrared radiation, the detector further comprising, above the silicon chip, an optical element (50) for focusing the far infrared rays on the first array, and an optical element (60) for focusing the visible light on the second array.

"Far infrared radiation" means here infrared wavelengths to which silicon is not sensitive. Particular wavelengths to which the invention relates are preferably in the band of 8 to 14 micrometers.

The visible light sensitive pixel array uses silicon as a light-sensitive material and this material is sensitive to visible light and near-infrared up to a wavelength of about 1100 nanometers. It will be assumed in the following that "visible light" extends to a near-infrared wavelength of about 1100 nanometers.

The pixel size, in surface area, of the second array may be at least five times, and preferably about ten times smaller than the first pixel array. The second array may occupy a small fraction, preferably less than 25% of the surface area of the first array. The second array may be adjacent an edge or a corner of the first array; exceptionally, it may also be located in the center of the first array.

The visible light photosensitive array may be divided into two laterally spaced portions, allowing 3D imaging in the visible domain A respective optical focusing element is then placed above each portion.

The first array may comprise a surface layer of organic pyroelectric material, namely a P(VDF-TrFE) copolymer, i.e. poly(vinylidenefluoride-co-trifluoroethylene), and electrodes on both sides of this layer to collect charges generated in the layer by the far infrared radiation to which this material is particularly sensitive.

The focusing optics may be a Fresnel lens, both for the visible light and the far infrared light. It is preferably polyethylene or silicon. It may also be chalcogenide glass, calcium, barium or magnesium fluoride, or germanium.

A sensor according to the invention is very simple since it includes only one integrated circuit chip, encapsulated in a housing that also encloses the optical elements for focusing the visible and far infrared light. It may therefore be manufactured at very low cost. It offers excellent detection reliability due to its multimodal operation, because false detections or non-detections of people may be canceled by merging the image data provided by the two pixel arrays. Finally, it offers, at lower cost, much richer information than conventional sensors.

Other features and advantages of the invention will appear on reading the following detailed description with reference to the accompanying drawings in which.

Figure 1:
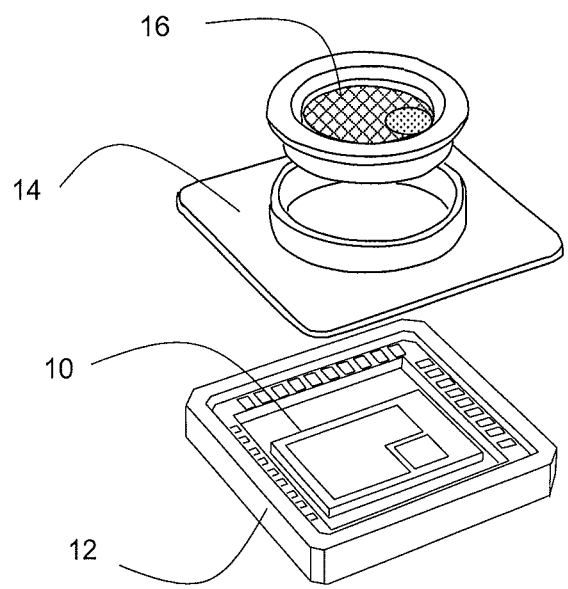
FIG. 1 shows an exploded view of an embodiment of a presence detector according to the invention.

FIG. 1 shows main elements of an embodiment of a compact multimodal detector according to the invention. The core of the detector is an integrated circuit chip 10 that may be encapsulated in a ceramic or plastic housing 12. The chip may be silicon manufactured using CMOS technology. The chip 10 includes a stack of three main elements:

- A first array of pixels, made sensitive to far infrared radiation, including the wavelength band of 8-14 micrometers, by deposition on a pyroelectric layer; note that the human body emits radiation at about 9 micrometers (blackbody radiation at 30° C.).
- A second array of pixels responsive to visible light, and more generally to wavelengths at which silicon is sensitive, that is to say between 300 and 1100 nanometers, including the visible spectrum (300 to 800 nanometers) and the very near infrared spectrum (800-1100 nanometers).
- Reading and signal processing circuitry for collecting the signals from each of the two arrays and thus obtain two electronic images of the scene captured by the detector, one in the visible light spectrum, the other in the far-infrared spectrum.

The detector housing is closed by a lid 14 that ensures the protection of the chip while letting through light and far infrared radiation from the outside towards the surface of the chip. The top part of lid 14 supports multimodal focusing optics 16. The focusing optics is multimodal in that it acts both on visible light and far infrared radiation. It comprises for this purpose an element that focuses the far infrared radiation onto an array of pixels responsive to this radiation to form an observed image of the scene, and an element that focuses the visible light onto another array of pixels smaller than the first and sensitive to visible light, to form a second image of the observed scene. Although this is not visible in FIG. 1 for reasons of simplicity of representation, the two focusing elements are preferably in different planes, the visible light element being closer to the surface of the chip than the far-infrared radiation element.

Figure 2:
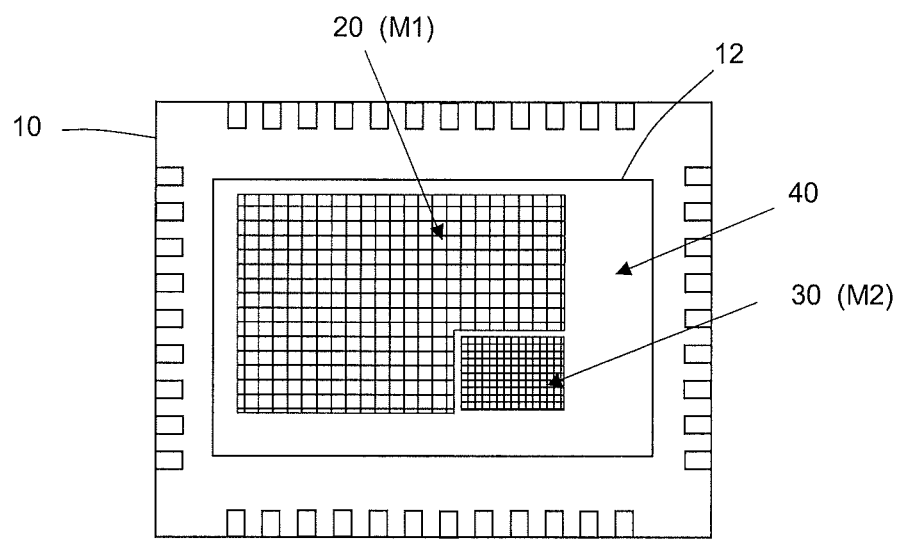
FIG. 2 shows a simplified top view of an integrated circuit forming the core of the sensor.

FIG. 2 shows a top view of the housing 12 and the chip 10. An area 20 is shown symbolically on the chip, which contains an array M1 of pixels sensitive to far-infrared radiation, especially in the wavelength band of 8 to 14 micrometers. The array preferably comprises at least 250 pixels so as to form an effective infrared image in which shapes can be recognized, including characteristic shapes of human presence. In a simple case, the array M1 may have about 16 lines and 16 columns of pixels. In another example, for a better image resolution, there may be 240 by 240 pixels. The surface area of each pixel may range from 1000 to 5000 square micrometers (about 30 to 70 micrometers per side), ensuring both sufficient sensitivity and compatibility with inexpensive focusing optics that offers sufficient optical accuracy for discriminating pixels in this size range.

Another zone 30 that contains an array M2 of pixels sensitive to visible light is shown on the chip, for example an array of active pixels wherein each pixel comprises a photodiode formed in the silicon of the chip, an amplifier transistor, and readout and reset control transistors. This array is sensitive to wavelengths from 300 to 800 nanometers, and even up to 1100 nanometers, silicon being sensitive up to this wavelength.

The array M2 may be smaller in surface area than the array M1, and preferably at least 5 or 10 times smaller. A similar number of rows and columns to that of the array M1 may however be used for the array M2. Indeed, the pixels of the array M2 can be much smaller than those of the far infrared sensitive array M1. They may for example have sides of 10 to 15 micrometers. Using a small portion of the integrated circuit chip to provide a visible light image having the same resolution as the far-infrared image negligibly affects the quality of the far-infrared array M1.

The rest of the integrated circuit chip (area 40 in FIG. 2) may comprise all the electronic circuitry necessary for operation of the two arrays, allowing the collection of both a visible light image and a far-infrared radiation image.

As is known, silicon is directly sensitive to visible light. The array M2 sensitive to visible light may therefore be directly exposed to visible light through the associated focusing optics.

But silicon is not sensitive to far-infrared radiation, especially in the desired wavelength band of 8 to 14 micrometers. To ensure the sensitivity of the pixels of the array M1 to far-infrared wavelengths, the zone 20 of the array M1 (excluding the zone 30 of the array M2) is covered with a layer of pyroelectric material that is sensitive to far-infrared radiation and locally converts the radiation into electrical charges. The electric charges generated pixel by pixel are measured by individual charge-voltage conversion circuits of an array readout circuit formed in the silicon chip under the pyroelectric layer; this charge measure provides the desired far-infrared image. Each pixel comprises a capacitance formed between an individual electrode of the pixel and an electrode common to all the pixels, the two electrodes being separated by a dielectric layer that is formed by the pyroelectric material. The array M1 thus comprises a mesh of rows and columns of pixel electrodes, and an elementary electric charge measuring circuit formed in the silicon of the chip, located under each pixel electrode and connected to this electrode.

A suitable pyroelectric material is P(VDF-TrFE), i.e. a poly(vinylidenefluoride-co-trifluoroethylene) copolymer wherein the pyroelectric compound is polyvinylidene fluoride (PVDF), present in proportions of 65 to 80%. Deposition methods are described in patent publication PCT/EP/2008/067289. The material is locally deposited on the area 20 of the chip, excluding the area 30, after formation of all the electronic circuitry in the silicon of the integrated circuit chip.

Figure 3:
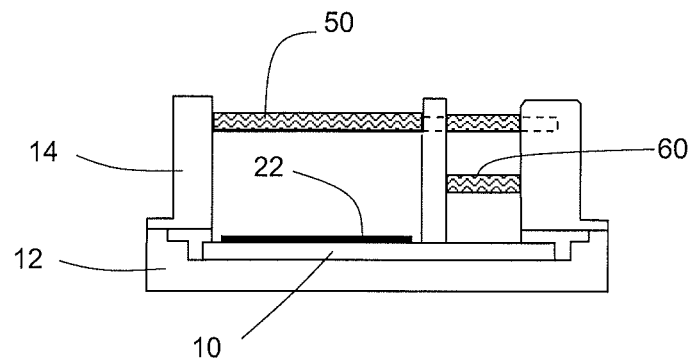
FIG. 3 shows a sectional view of the detector, with image projection optical elements associated with the circuit.

FIG. 3 is a sectional side view of the detector, showing the optical focusing elements located above the integrated circuit chip 10. Reference 22 designates the layer of pyroelectric material, present above the infrared array but absent above the visible light array. The electrodes associated with this layer for defining the pixels are not shown in FIG. 3.

The infrared focusing optics is denoted by reference 50 and the visible light focusing optics is designated by reference 60; the infrared optics 50 focus an image on a larger surface (that of the array M1) than the visible light optics 60. The optics 50 is located higher than the visible light optics above the surface of the chip. The focusing optics are preferably Fresnel lenses formed in a material transparent to the respective visible or far infrared spectrum. The material may be the same or not for the two lenses.

The optical elements 50 and 60 may comprise the following materials: preferably polyethylene that minimizes the manufacturing costs while being compatible with the used image resolution (pixels of at least 1000 square micrometers and at most 5000 or 10000 square micrometers); focusing optics 50 and 60 may eventually also be silicon, chalcogenide glass, or germanium. Polyethylene Fresnel lenses offer apertures up to f/0.5 where f is the focal length of the lens.

If the aperture of the optics is substantially equal to 1, the height of the optics above the surface of the chip is about the diameter of the optics.

Figure 4:
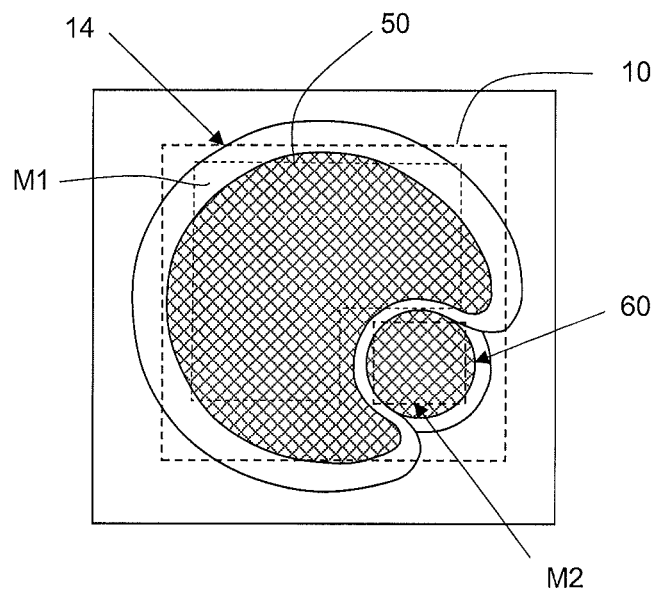
FIG. 4 shows a top view of the detector.

FIG. 4 shows a top view of the detector, i.e. mainly showing the focusing optics 50 (far infrared) and 60 (visible light). The outlines of the integrated circuit chip 10 and of the arrays M1 and M2 of this circuit are shown in dashed lines.

Figure 5:
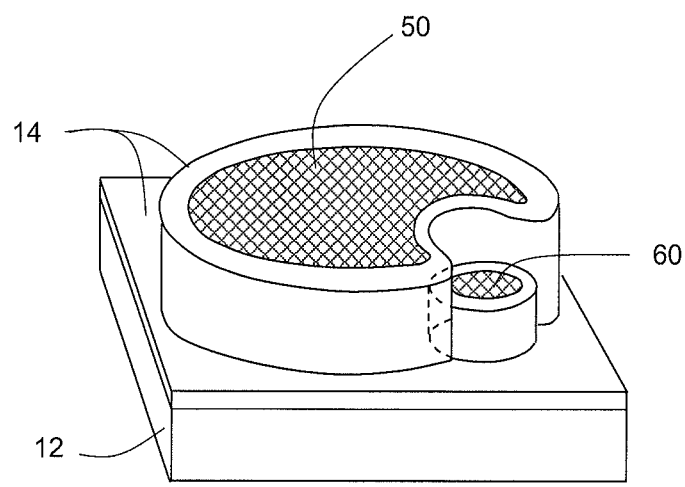
FIG. 5 shows a perspective view of the detector.

FIG. 5 shows the sensor in perspective view, illustrating again the height difference of the focusing lenses 50 and 60 relative to the surface of the chip.

In an exemplary embodiment, the integrated circuit chip is about $5\times10$ mm$^2$, the diameter of the infrared lens is about 12.5 mm, the focal distance is 6.5 mm, and the optics 50 is located 6.5 mm above the surface of the chip. The sensor is therefore very compact. In this example, the area of the visible light array M2 is of the order of $1.5\times1.5$ mm$^2$; the visible light focusing optics 60 has a diameter of 4 mm, and its focal length is 3 mm; it is located 3 mm above the surface of the chip.

In another example, the integrated circuit chip is approximately $6\times8$ mm$^2$, the infrared optics has a diameter of 8 millimeters, with a focal length of 4 mm and is located 4 mm above the surface of the chip. The visible light lens still has a diameter of 4 mm and a focal length of 3 mm and it is located 3 mm above the chip.

To minimize costs, the sensor may be devoid of a correlated double-sampling system, i.e. a cyclical light-masking system using a differential measurement between the charge values obtained in the presence of light (first half period of a masking cycle) and in the absence of light (second half-period of the masking cycle). A resulting disadvantage may be the difficulty in observing slowly moving images, but this is seldom a drawback for the detection of persons or for the detection of human-computer interaction, where there is in principle sufficient movement for reconstructing an image even without using correlated double-sampling. Image processing by a processor (in the chip or outside the chip) may be used to compensate for the lack of correlated double-sampling and produce movement information by subtracting successive images.

In a particular embodiment, the detector may be further adapted to produce a three-dimensional image, i.e. produce depth information for different points of the image. This may be achieved by combining the infrared array with two arrays of pixels sensitive to visible light, which are spaced apart from each other. A focusing optics is respectively associated with each of these two visible light arrays and focuses the same image scene on the two arrays. A correlation performed between the images of the two arrays may determine for each pixel of a first image the pixel of the second image that has seen the same point in the observed scene. The distance between the two pixels, i.e. the relative position difference between the two pixels within their respective arrays, directly represents depth information, that is to say a distance between the detector and the point of the scene seen by these two pixels; in a general case (same optical axis for the lenses) a zero distance between the two pixels corresponds to an infinite depth; the depth decreases as the distance between the two pixels increases.

Figure 6:
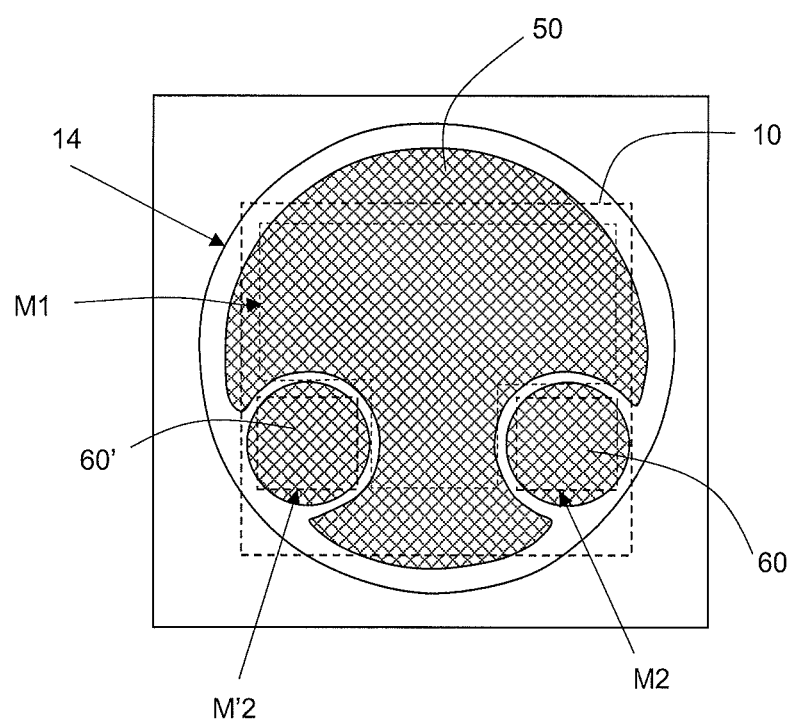
FIG. 6 shows a top view of an alternative embodiment.

FIG. 6 is a top view of a detector with this configuration, having two arrays M2 and M2' of visible light photosensitive pixels, placed on either side of the far-infrared photosensitive pixel array and below respective focusing lenses 60 and 60'.

It may be noted that three-dimensional information may also be obtained by using other known means, for example a so-called time of flight measurement; the flight time is the time taken for a light pulse to go to a point of the observed scene and back. Knowing the speed of light, the distance is deduced from the time. This measure, however, involves more sophisticated means, in particular a pulsed light source (e.g. a laser diode) and synchronizing the operation of the read circuits of the arrays with the light pulse emission.

The image data provided by the arrays of pixels in response to visible light and far infrared radiation may be used separately or in combination. Data merging algorithms may be implemented either in the chip or outside to process visible and far-infrared images and increase the reliability of person detection by eliminating the detection results that are not confirmed by the two imaging modes.

The invention claimed is:

1. A human presence detector comprising, on a same silicon chip:
    a first array of pixels configured with a pyroelectric layer for converting received far-infrared radiation into electric charges;
    at least one second array of pixels responsive to visible light adjacent the first array;
    a circuit for reading charges generated in each of the arrays by the visible light or the far-infrared radiation;
    an optical element for focusing the far-infrared radiation on the first array; and
    an optical element for focusing the visible light on the second array.

2. The detector according to claim 1, wherein the second array occupies a portion of less than 25% of the surface area of the first array.

3. The detector according to claim 1, wherein the pixel size of the second array is at least five times smaller, in surface area, than the pixels of the first array.

4. The detector according to claim 1, wherein the second array is adjacent an edge or a corner of the first array.

5. The detector according to claim 1, wherein the first array comprises:
    a surface layer of an organic pyroelectric material, and
    electrodes on both sides of the layer to collect charges generated in the layer by infrared radiation.

6. The detector according to claim 5, wherein the pyroelectric material comprises a poly(vinylidenefluoride-co-trifluoroethylene) copolymer.

7. The detector according to claim 1, wherein the second array is divided into two laterally spaced portions with respective optical focusing elements configured for three-dimensional imaging.

8. The detector according to claim 1, wherein at least one of the optical focusing elements is a Fresnel lens.

9. The detector according to claim 1, wherein at least one of the optical focusing elements comprises one of: polyethylene, silicon, chalcogenide glass, calcium, barium or magnesium fluoride, and germanium.

* * * * *